United States Patent [19]

Zietlow

[11] Patent Number: 4,748,131

[45] Date of Patent: May 31, 1988

[54] METHOD FOR INCREASING RADIATION HARDNESS OF MOS GATE OXIDES

[75] Inventor: Thomas C. Zietlow, Pasadena, Calif.

[73] Assignee: The Aerospace Corporation, El Segundo, Calif.

[21] Appl. No.: 11,563

[22] Filed: Feb. 6, 1987

[51] Int. Cl.[4] ........................................... H01L 21/425
[52] U.S. Cl. ..................................... 437/24; 437/233; 437/240
[58] Field of Search ............ 148/DIG. 118; 357/23.1, 357/91; 437/24, 240, 233

[56] References Cited

U.S. PATENT DOCUMENTS 3,933,530 1/1976 Mueller et al. .................... 339/91 X Primary Examiner—Olik Chaudhuri
Attorney, Agent, or Firm—William J. Burke

[57] ABSTRACT

The resistance to radiation damage of metal-oxide-semiconductor devices is improved by the incorporation of fluorine into the gate oxide of the device by robust procedures. The introduction of fluorine into the oxide results in a significant reduction of radiation-induced interface state density. Three methods by which the fluorine is introduced into the gate oxide are: (1) silicidation of the polysilicon gate by chemical vapor deposition using tungsten hexafluoride as a source gas; (2) ion implantation of fluorine into the polysilicon layer on top of the gate oxide, followed by a high temperature anneal to allow the fluorine to migrate into the oxide; and (3) growth of the oxide in a dilute $NF_3$ ambient.

5 Claims, 1 Drawing Sheet

METHOD FOR INCREASING RADIATION HARDNESS OF MOS GATE OXIDES

STATEMENT OF GOVERNMENT INTEREST

The invention described herein may be manufactured and used by or for the Government of the United States for governmental purposes without the payment of royalty therefor.

BACKGROUND OF THE INVENTION

1. Field of the Invention

The present invention relates to a method for hardening integrated circuits in general and MOS circuits in particular.

2. Prior Art

Elimination of failures or performance degradation of integrated circuits due to exposure to high energy radiation is an important goal for all space and military electronic systems.

One very important failure and degradation mechanism which is operative in VLSI MOSFET circuits is the development of radiation-induced interface states in the thin gate oxides which control MOSFET operation. The current state-of-the-art processing of VLSI MOS devices is based on fine control of the various wafer processing steps. This control consists of minimizing the water content in the oxide and not allowing temperatures to exceed 900° C. at any time following the gate oxidation step. An example of this approach is the Sandia National Laboratory's 4/3 micron process. The process is described in more detail in Winokur, P. S.; Errett, E. B.; Fleetwood, D. M.; Dressendorfer, P. V.; and Turpin, D. C., in the 1985 *IEEE Transactions of Nuclear Science*, (NS-32), page 3954. Some of the key features of this process are a 1000° C. dry oxidation, a 900° C. post-gate anneal in forming gas, and a TEOS densification step. These parameters were determined from a long series of optimization studies of the Sandia device fabrication process and are relevant to the particular Sandia production facility. The optimal process sequence results in best case voltage shifts due to interface state generation of about 1.5 V at 1 Mrad(Si) total dose.

There are several shortcomings in the current state-of-the-art radiation hardening techniques. First of all, there is still significant interface state growth upon exposure to ionizing radiation in devices produced by these techniques. Second, the process restricts the use of common commercial IC processing steps, such as high temperature reflow anneals, which are used to increase device yield and performance. Third, these processes must be strictly controlled; a very small variation can result in a dramatic reduction in device radiation hardness. Thus, current radiation-hardened technology results in low yield and parts which suffer performance degradation due to interface state growth in an ionizing radiation environment.

Another method for improving the radiation hardness of silicon solar cells by implantation of lithium ions into the wafer is described in U.S. Pat. No. 4,608,452. The lithium ions are used to create electrically active defects. Those defects can then be annealed out at a lower temperature than radiation-induced defects. One shortcoming of this method is that the lithium ions create different defects and do not directly reduce the existing defects in the silicon.

It is therefore an object of this invention to improve radiation-hardening of MOS circuits by reducing the growth of interface states caused by ionizing radiation.

Another object of this invention is to permit the use of common commercial IC processing steps in the production of rad-hard MOS circuits.

Yet another object of this invention is to loosen the process restrictions for a rad-hard technology and to improve yield.

Another object of this invention is to provide a simple method of reducing the number of electrically active defects in the silicon dioxide.

SUMMARY OF THE INVENTION

The present invention provides a method by which the radiation hardness of MOS devices is increased by the incorporation of fluorine into the gate oxide of MOS devices by robust procedures, resulting in a significant reduction of radiation-induced interface state density and thereby produces enhanced radiation hardened MOS circuits.

BRIEF DESCRIPTION OF THE DRAWINGS

The features and advantages of the invention summarized above will be more fully understood by the following detailed description taken in conjunction with the accompanying drawings in which.

DETAILED DESCRIPTION OF THE INVENTION

The concept of using fluorine to inhibit the growth of radiation-induced interface states approaches the radiation-hardening of MOS devices in a fundamentally different manner than current processes. Instead of attempting to maintain the integrity of the initial thermal oxide/silicon interface by very tight process control as is now done, the fluorine-incorporation hardening procedure permits significant process variability while ensuring radiation hardness. This will improve circuit yield and cost of radiation hardened circuits.

Fluorine incorporation into the gate oxide can be accomplished as part of several processes. Three of those processes are disclosed below. They are: (1) silicidation of the polysilicon gate by chemical vapor deposition using tungsten hexafluoride as a source gas; (2) ion implantation of fluorine into the polysilicon gate layer of the device followed by an anneal allowing the fluorine to migrate into the oxide; and (3) growth of the oxide in a dilute $NF_3$ ambient.

In one embodiment of the invention, fluorine is incorporated into the gate oxide by silicidation of the polysilicon gate by chemical vapor deposition using tungsten hexafluoride as a source gas. The procedure is described generally in Deal, M. D.; Pramanik, D; and Saxena, A. N.; Saraswat, K. C., in the 1985 *Proceedings of the IEEE VLSI Multilevel Interconnection Conference*, p. 324. The important steps in the silicidation process are the formation of standard n+-doped polysilicon gates, followed by a chemical vapor deposition of tungsten using tungsten hexafluoride as the source gas and silane as the reductant. The tungsten hexafluoride is reduced by the silicon in the gate, forming tungsten silicide. The silicidation reaction is followed by a 1000° C., 15-minute anneal in nitrogen. The fluorine trapped during the CVD reaction migrates into the oxide during the high temperature anneal. The fluorine in the oxide does not cause any deleterious effects on device characteristics before radiation as described in the above reference.

Figure 1:
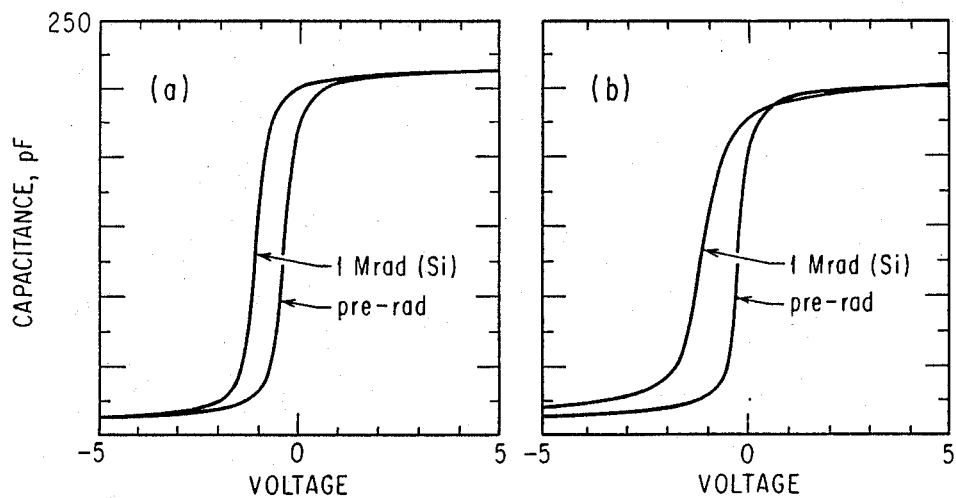
FIG. 1a and FIG. 1b are the capacitance-voltage data taken before and after ionizing radiation of a sample with fluorine incorporated into the oxide by the silicidation processing and a sample with no fluorine in the oxide, respectively.

Devices produced by these methods exhibit enhanced radiation hardness. For example, the radiation response of a thin (30 nm) oxide, n-Si substrate MOS capacitor irradiated under 0 V gate bias, at a dose rate of 156 krad(Si)/hour, is shown in FIG. 1a. The key feature to notice is that the C-V curves are parallel, not exhibiting a change in slope which is indicative of the presence of interface states. At a dose of 1 Mrad(Si), the radiation-induced interface state density is $<3\times10^{10}$ states/cm$^2$-eV, the limit of the sensitivity of the high frequency analysis. This figure is calculated from a modified Terman analysis, which compares the slope of the C-V curve prior to radiation to the slope of the post-radiation C-V curve. For comparison, an MOS capacitor which went through the same oxide growth procedure, but not the silicidation processing and therefore no fluorine is present in the oxide, was irradiated under the same conditions and the relevant high frequency C-V plots are displayed in FIG. 1b. In addition to the shift of the curve to the left caused by hole trapping, there is a noticeable change in the slope of the control (no fluorine) curves resulting from formation of radiation-induced interface states. By assuming that the interface states are neutral at midgap and that the interface states in the upper half of the Si bandgap are predominately acceptors, while those in the lower half of the bandgap are predominately donors, the charge due to the interface states and trapped holes may be separated.

Figure 2:
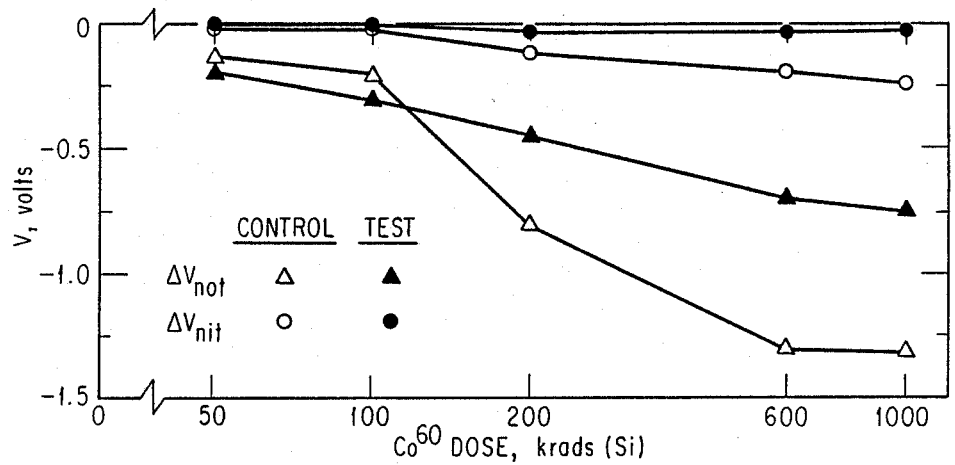
FIG. 2 is a graph of the calculated voltage shifts due to interface state growth and oxide hole trapping during irradiation of the samples described above.

The two components of the threshold voltage shift of the capacitors are shown in FIG. 2. The test samples trapped slightly more hole charge at low doses ($<200$ krad(Si)) than the control capacitors, but at higher total doses (greater than 200 krad(Si)) the trapped charge density in the fluoridated oxides was lower than in the control sample. For example, the voltage shift due to trapped hole density in the fluorinated oxides was about $-0.75$ V at 1 Mrad(Si), about 40% less that the $-1.3$ V of the control sample at the same dose. The interface state density of the control sample shows the usual delayed formation, but steadily grows to $6\times10^{11}$ states/cm$^2$-eV at 1 Mrad(Si).

While quantitative comparison of these results with published results is complicated by the differences in oxide thickness, the fluoridated MOS capacitors form at least an order of magnitude less radiation-induced interface state density than Sandia structures.

Figure 3:
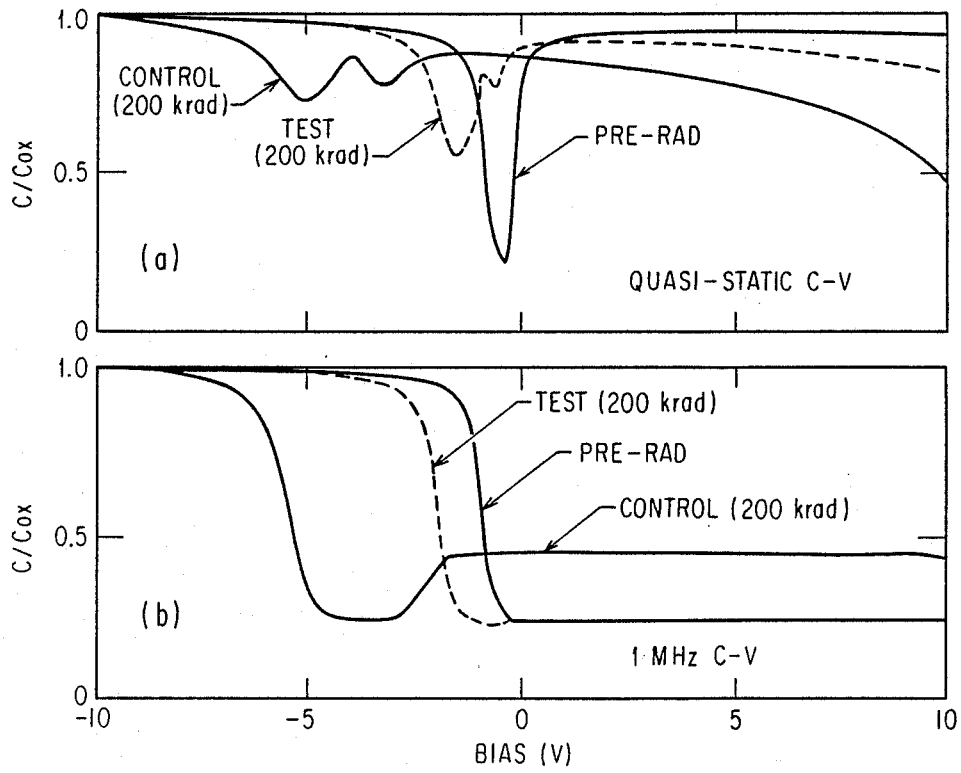
FIG. 3a and FIG. 3b show the high and low frequency capacitance voltage measurements for a sample which has undergone a fluorine implant procedure as described below and for a control sample.

Another method for incorporating fluorine into the gate oxide is by ion implantation of fluorine ions into a polysilicon layer on top of the thermal oxide, followed by a high temperature anneal to allow the fluorine to migrate into the oxide. For example, a thermal pyrogenic oxide (46 nm) grown on silicon (100), followed by polysilicon deposition and doping (500 nm) has been implanted with $^{19}$F (1E14 ions/cm$^2$), followed by a 1000° C., 30 minute anneal. The fluorine migrates into the oxide during the anneal (as monitored by Secondary Ion Mass Spectrometry). The radiation results of such an implantation process are displayed in FIG. 3. The high and low frequency characteristics of a test sample and a control sample are compared. The control sample underwent the same growth conditions and anneal but not the implant. A comparison of those characteristics reveals that the implantation has resulted in a factor of five (5) improvement in both the radiation-induced oxide trapped charge and the interface state density over the control sample.

The third method outlined in this invention is the use of a fluorine source, such as nitrogen trifluoride, to be introduced during the thermal oxidation of the single crystal silicon. The NF$_3$ decomposes on the hot silicon surface, forming fluorine atoms which attack the silicon, forming a passivating layer of fluorinated silicon atoms, which inhibits the formation of interface state precursors.

It is believed that fluorine incorporation produces the results discussed in the above examples because the fluorine strongly bonds to the interface state precursor species at the silicon/silicon dioxide interface, inhibiting the formation reaction. Results of radiation testing indicate an order of magnitude reduction in radiation-induced interface state density over current state-of-the-art rad-hard MOS device structures.

Although the invention has been described in terms of a preferred embodiment, it will be obvious to those skilled in the art that many alterations and modifications may be made without departing from the invention. Accordingly, it is intended that all such alterations and modifications be included within the spirit and scope of the invention.

I claim:

1. A method for improving the radiation damage resistance of silicon metal-oxide-semiconductor (MOS) devices by implanting fluorine atoms into a polysilicon layer above the oxide followed by a high temperature anneal thereby allowing the fluorine to migrate into the oxide.

2. The method as claimed in claim 1 further comprising the step of implanting fluorine-containing ions into the polysilicon layer above the oxide followed by a high temperature anneal thereby allowing the fluorine to migrate into the oxide.

3. The method as claimed in claim 2 wherein the fluorine-containing ions are silicon difluoride ions or silicon trifluoride ions.

4. The method as claimed in claim 1 further comprising the step of growing the oxide in an oxidation furnace with an oxygen/nitrogen trifluoride ambient thereby incorporating fluorine directly into the oxide.

5. The method as claimed in claim 1 further comprising the step of growing the polysilicon layer by chemical vapor deposition using tungsten hexafluoride as the source gas and silane as the reductant, followed by a high temperature anneal thereby allowing the fluorine to migrate into the oxide.

* * * * *